(12) United States Patent
Harris et al.

(10) Patent No.: US 8,310,387 B2
(45) Date of Patent: Nov. 13, 2012

(54) SAMPLING METHOD FOR TIME-INTERLEAVED DATA CONVERTERS IN FREQUENCY-MULTIPLEXED COMMUNICATIONS SYSTEMS

(75) Inventors: Brannon Harris, Austin, TX (US); Sunder S. Kidambi, Austin, TX (US); Michael P. Anthony, Andover, MA (US)

(73) Assignee: Intersil Americas Inc., Milpitas, CA (US)

( * ) Notice: Subject to any disclaimer, the term of this patent is extended or adjusted under 35 U.S.C. 154(b) by 34 days.

(21) Appl. No.: 12/862,470

(22) Filed: Aug. 24, 2010

(65) Prior Publication Data

US 2011/0128175 A1    Jun. 2, 2011

Related U.S. Application Data

(60) Provisional application No. 61/265,168, filed on Nov. 30, 2009.

(51) Int. Cl.
*H03M 1/12* (2006.01)
(52) U.S. Cl. ........ 341/155; 341/118; 341/120; 341/141; 341/159
(58) Field of Classification Search .......... 341/118, 341/120, 141, 142, 155
See application file for complete search history.

(56) References Cited

U.S. PATENT DOCUMENTS

| | | | | |
|---|---|---|---|---|
| 6,031,869 A * | 2/2000 | Priebe et al. | ... | 375/224 |
| 6,337,877 B1 | 1/2002 | Cole et al. | | |
| 6,384,756 B1 * | 5/2002 | Tajiri et al. | ... | 341/120 |
| 6,650,624 B1 | 11/2003 | Quigley et al. | | |
| 6,704,372 B2 | 3/2004 | Zhang et al. | | |
| 6,791,995 B1 | 9/2004 | Azenkot et al. | | |
| 7,015,842 B1 * | 3/2006 | Gupta et al. | ... | 341/122 |
| 7,538,708 B2 * | 5/2009 | Xu | ... | 341/155 |
| 7,839,313 B2 * | 11/2010 | Kidambi | ... | 341/118 |
| 7,961,123 B2 * | 6/2011 | Nagarajan et al. | ... | 341/118 |
| 8,004,435 B2 * | 8/2011 | Waki et al. | ... | 341/122 |
| 8,009,070 B2 * | 8/2011 | Johansson et al. | ... | 341/118 |
| 8,063,803 B2 * | 11/2011 | Kidambi | ... | 341/118 |
| 2009/0021412 A1 * | 1/2009 | Gustafsson | ... | 341/155 |
| 2009/0115650 A1 * | 5/2009 | Tietjen et al. | ... | 341/141 |
| 2010/0253557 A1 * | 10/2010 | Kidambi | ... | 341/118 |
| 2011/0063149 A1 * | 3/2011 | Kidambi | ... | 341/118 |
| 2011/0140946 A1 * | 6/2011 | Sheppard | ... | 341/155 |

* cited by examiner

*Primary Examiner* — Linh Nguyen
(74) *Attorney, Agent, or Firm* — Cesari and McKenna, LLP (57) ABSTRACT

A wide band analog-to-digital converter used in a frequency multiplexed communication system. The converter includes a plurality, M, of time-interleaved analog-to-digital converter subunits (ADC subunits). The sampling rate, FS1, of the M ADC subunits is selected to locate one or more integer multiples of a Nyquist frequency of a respective subunit ADC in one or more guard bands, and/or such that one or more integer multiples of FS1 are also located in the guard bands.

16 Claims, 6 Drawing Sheets

| CHANNEL | LOWER EDGE (MHz) | UPER EDGE (MHz) |
|---|---|---|
| 2 | 54 | 60 |
| 3 | 60 | 66 |
| 4 | 66 | 72 |
| 1 | 72 | 76 |
| 5 | 76 | 82 |
| 6 | 82 | 88 |
| 95 | 90 | 96 |
| 96 | 96 | 102 |
| 97 | 102 | 108 |
| 98 | 108 | 114 |
| 99 | 114 | 120 |
| 14 | 120 | 126 |
| 15 | 126 | 132 |
| 16 | 132 | 138 |
| 17 | 138 | 144 |
| 18 | 144 | 150 |
| 19 | 150 | 156 |
| 20 | 156 | 162 |
| 21 | 162 | 168 |
| 22 | 168 | 174 |
| 7 | 174 | 180 |
| 8 | 180 | 186 |
| 9 | 186 | 192 |
| 10 | 192 | 198 |
| 11 | 198 | 204 |
| 12 | 204 | 210 |
| 13 | 210 | 216 |
| 23 | 216 | 222 |
| 24 | 222 | 228 |
| 25 | 228 | 234 |
| 26 | 234 | 240 |
| 27 | 240 | 246 |
| 28 | 246 | 252 |
| 29 | 252 | 258 |
| 30 | 258 | 264 |
| 31 | 264 | 270 |
| 32 | 270 | 276 |
| 33 | 276 | 282 |
| 34 | 282 | 288 |
| 35 | 288 | 294 |
| 36 | 294 | 300 |
| 37 | 300 | 306 |
| 38 | 306 | 312 |
| 39 | 312 | 318 |
| 40 | 318 | 324 |
| 41 | 324 | 330 |
| 42 | 330 | 336 |
| 43 | 336 | 342 |
| 44 | 342 | 348 |
| 45 | 348 | 354 |
| 46 | 354 | 360 |
| 47 | 360 | 366 |
| 48 | 366 | 372 |
| 49 | 372 | 378 |
| 50 | 378 | 384 |
| 51 | 384 | 390 |
| 52 | 390 | 396 |
| 53 | 396 | 402 |
| 54 | 402 | 408 |
| 55 | 408 | 414 |
| 56 | 414 | 420 |
| 57 | 420 | 426 |
| 58 | 426 | 432 |
| 59 | 432 | 438 |
| 60 | 438 | 444 |
| 61 | 444 | 450 |
| 62 | 450 | 456 |
| 63 | 456 | 462 |
| 64 | 462 | 468 |
| 65 | 468 | 474 |
| 66 | 474 | 480 |
| 67 | 480 | 486 |
| 68 | 486 | 492 |
| 69 | 492 | 498 |
| 70 | 498 | 504 |
| 71 | 504 | 510 |
| 72 | 510 | 516 |
| 73 | 516 | 522 |
| 74 | 522 | 528 |
| 75 | 528 | 534 |
| 76 | 534 | 540 |
| 77 | 540 | 546 |
| 78 | 546 | 552 |
| 79 | 552 | 558 |
| 80 | 558 | 564 |
| 81 | 564 | 570 |
| 82 | 570 | 576 |
| 83 | 576 | 582 |
| 84 | 582 | 588 |
| 85 | 588 | 594 |
| 86 | 594 | 600 |
| 87 | 600 | 606 |
| 88 | 606 | 612 |
| 89 | 612 | 618 |
| 90 | 618 | 624 |
| 91 | 624 | 630 |
| 92 | 630 | 636 |
| 93 | 636 | 642 |
| 94 | 642 | 648 |
| 100 | 648 | 654 |
| 101 | 654 | 660 |
| 102 | 660 | 668 |
| 103 | 668 | 672 |
| 104 | 672 | 678 |
| 105 | 678 | 684 |
| 106 | 684 | 690 |
| 107 | 690 | 696 |
| 108 | 696 | 702 |
| 109 | 702 | 708 |
| 110 | 708 | 714 |
| 111 | 714 | 720 |
| 112 | 720 | 726 |
| 113 | 726 | 732 |
| 114 | 732 | 738 |
| 115 | 738 | 744 |
| 116 | 744 | 750 |
| 117 | 750 | 756 |
| 118 | 756 | 762 |
| 119 | 762 | 768 |
| 120 | 768 | 774 |
| 121 | 774 | 780 |
| 122 | 780 | 786 |
| 123 | 786 | 792 |
| 124 | 792 | 798 |
| 125 | 798 | 804 |
| 126 | 804 | 810 |
| 127 | 810 | 816 |
| 128 | 816 | 822 |
| 129 | 822 | 828 |
| 130 | 828 | 834 |
| 131 | 834 | 840 |
| 132 | 840 | 846 |
| 133 | 846 | 852 |
| 134 | 852 | 858 |
| 135 | 858 | 864 |
| 136 | 864 | 870 |
| 137 | 870 | 876 |
| 138 | 876 | 882 |
| 139 | 882 | 888 |
| 140 | 888 | 894 |
| 141 | 894 | 900 |
| 142 | 900 | 906 |
| 143 | 906 | 912 |
| 144 | 912 | 918 |
| 145 | 918 | 924 |
| 146 | 924 | 930 |
| 147 | 930 | 936 |
| 148 | 936 | 942 |
| 149 | 942 | 948 |
| 150 | 948 | 954 |
| 151 | 954 | 960 |
| 152 | 960 | 966 |
| 153 | 966 | 972 |
| 154 | 972 | 978 |
| 155 | 978 | 984 |
| 156 | 984 | 990 |
| 157 | 990 | 996 |
| 158 | 996 | 1002 |

*FIG. 4*

| M | J | FS1 (MHz) | FS (MHz) |
|---|---|---|---|
| 2 | 84 | 1008 | 2016 |
| 3 | 56 | 672 | 2016 |
| 4 | 42 | 504 | 2016 |
| 5 | 34 | 408 | 2040 |
| 6 | 28 | 336 | 2016 |
| 7 | 24 | 288 | 2016 |
| 8 | 21 | 252 | 2016 |
| 9 | 19 | 228 | 2052 |
| 10 | 17 | 204 | 2040 |
| 11 | 16 | 192 | 2112 |
| 12 | 15 | 180 | 2160 |
| 13 | 15 | 180 | 2340 |
| 14 | 12 | 144 | 2016 |
| 16 | 11 | 132 | 2112 |
| 17 | 10 | 120 | 2040 |
| 19 | 9 | 108 | 2052 |
| 21 | 8 | 96 | 2016 |
| 24 | 8 | 96 | 2304 |
| 28 | 6 | 72 | 2016 |
| 32 | 6 | 72 | 2304 |
| 34 | 5 | 60 | 2040 |
| 42 | 4 | 48 | 2016 |
| 56 | 3 | 36 | 2016 |
| 57 | 3 | 36 | 2052 |
| 64 | 3 | 36 | 2304 |
| 84 | 2 | 24 | 2016 |
| 128 | 2 | 24 | 3072 |
| 167 | 1 | 12 | 2004 |

FIG. 5

| M | J | FS1 (MHz) | FS (MHz) |
|---|---|---|---|
| 2 | 22 | 1320 | 2640 |
| 3 | 15 | 900 | 2700 |
| 4 | 11 | 660 | 2640 |
| 5 | 9 | 540 | 2700 |
| 6 | 8 | 480 | 2880 |
| 7 | 7 | 420 | 2940 |
| 8 | 6 | 360 | 2880 |
| 9 | 5 | 300 | 2700 |
| 11 | 4 | 240 | 2640 |
| 15 | 3 | 180 | 2700 |
| 16 | 3 | 180 | 2880 |
| 22 | 2 | 120 | 2640 |
| 43 | 1 | 60 | 2580 |

FIG. 6

SAMPLING METHOD FOR TIME-INTERLEAVED DATA CONVERTERS IN FREQUENCY-MULTIPLEXED COMMUNICATIONS SYSTEMS

RELATED APPLICATION

This application claims the benefit of U.S. Provisional Application No. 61/265,168, filed on Nov. 30, 2009. The entire teachings of the above application are incorporated herein by reference.

BACKGROUND OF THE INVENTION

Interleaved analog-to-digital converters, henceforth called "converters", are comprised of two or more component converters that sample a common signal at a common rate, but are skewed in sampling time to increase the aggregate sample rate of the system. The outputs of the components are time-interleaved into a common output in an order consistent with their sample timing.

Examples of time-interleaved analog-to-digital converters are described in a co-pending U.S. patent application entitled "CABLE GATEWAY USING A CHARGE-DOMAIN PIPELINE ANALOG TO DIGITAL CONVERTER", Ser. No. 61/113,661 filed Nov. 12, 2008, and a co-pending U.S. patent application entitled "ERROR ESTIMATION AND CORRECTION IN A TWO-CHANNEL TIME-INTERLEAVED ANALOG-TO-DIGITAL CONVERTER", Ser. No. 12/419,599 filed Apr. 7, 2009, the entire contents of each of which are hereby incorporated herein by reference in their entirety.

Time-interleaving can be a means of achieving high sample rates with a relatively low tradeoff factor in other parameters of consequence, such as size, cost and/or power. However, to achieve performance from the interleaved system that approaches the performance of a single component, all components in the system must be well-matched in their sample timings, amplitude responses and phase responses. Mismatches in these parameters, and possibly others, of the of the component converters degrade the spurious response of the aggregate system.

Calibration is often employed to reduce the mismatches of the components—calibration addresses the cause. Alternatively post-converter data processing may be employed to correct the errors using signal processing of the interleaved data—post processing addresses the effect. Both methods require some form of error detection and the method described here is equally applicable to both. Henceforth, "calibration" will is be used to describe either mismatch reduction or error correction.

Amplitude response mismatch is sufficient to demonstrate the merits of the method for interleaving described here. This should not, however, imply a limitation of this method to addressing only the amplitude mismatch problem.

Amplitude response mismatch can be described as the mismatch in the amplitude responses of the component converters wherein the amplitude response of any component converter can be characterized by a polynomial. Higher-order polynomial terms are, in general, more computationally expensive to calibrate. Consequently, only those terms necessary to achieve the desired spurious performance from the system are typically addressed. For the purposes of demonstrating the foregoing interleaved sampling method, it is sufficient to consider the zero- and first-order coefficients in the amplitude response polynomials. These coefficients represent the offset and gain of the components.

SUMMARY OF THE INVENTION

The Problems

1. Accurate error metrics for certain component mismatches may be difficult or impossible to obtain when the signal supplied to the system contains a significant portion of its power at or near an integer multiple of the Nyquist frequency (half the sampling frequency) of a component converter. In particular, this applies to mismatches in gain, sample timing, bandwidth (spectral response) and perhaps other characteristics.
2. Insufficient calibration or correction of mismatch in the offsets of the component converters results in spurious content in the output spectrum of the aggregate interleaved system located at integer multiples of the sample frequency of a component converter.

A Solution

By selecting the sampling frequency appropriately, the two problems noted above may be mitigated for certain frequency-multiplexed communication systems. These systems are generally characterized as having a signal spectrum that is divided into sub-spectra called channels. For maximal use of the total spectrum, channels would preferably abut each other. However, to mitigate inter-channel interference, a small guard band typically separates them. These guard bands are small portions of the spectrum with little information and low signal power content.

1. With regard to the first problem, the sampling frequency can be selected to locate the integer multiples of the Nyquist frequency of a component converter in the guard bands of a frequency-multiplexed system, thus ensuring low power in the input signal at these problem frequencies. This allows high fidelity in the error metrics used for calibration.
2. With regard to the second problem, the sampling frequency can be selected to locate all integer multiples of the sampling frequency of a component converter in the guard bands of a frequency-multiplexed system, thereby placing the spurious content in the converter output due to offset mismatch among the components in the guard-band regions. If the system design is such that digital signal processing succeeding the converter is relatively insensitive to spurious content in the guard bands, further offset calibration the interleaved converter may be circumvented.

Since the sampling frequency is twice the Nyquist frequency, the criterion for solving the first problem also solves the second.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of an example embodiment of the invention follows. It should be understood that the present invention has wide application to the use of time interleaved analog to digital converters in frequency multiplexed systems, wherein the total bandwidth available to the system is divided into two or more non-overlapping frequency bands. The frequency bands are then used by different communicating sources. In such systems, a receiver may include front end analog signal processing components such as amplifiers, filters, and down-converters. A time interleaved analog to digital converter uses two or more subunit converters to provide a digital signal representative of the received signal(s) of interest. As will be understood from the discussion below, the sampling frequency of the time interleaved analog to digital converter is selected depending upon the location of guard bands that are defined in the system.

Therefore, while the discussion the follows is of a particular example of the invention as used in a cable network application, it should be understood that the invention is generally applicable to other types of frequency multiplexed systems.

Cable Gateway Example

Many cable communication signal receivers presently use analog tuner devices to demodulate a small portion of the cable system spectrum down to a low frequency. Relatively speaking, the tuner output has a low center frequency and low total bandwidth, thus allowing a low speed analog-to-digital converter to be used to digitize the data.

Cable modem and set-top-box systems are trending toward more channels to provide faster broadband access and more video services to the home. Future systems, therefore, require either wider bandwidth tuners or more narrow-bandwidth tuners. This poses a scaling problem that makes alternative to the tuner concept more attractive over time.

One alternative to the tuner is to digitize the entire bandwidth of the cable system. Once this is achieved, the number of channels decoded from the spectrum is completely defined in the digital domain. Thus the incremental cost for each additional channel is relatively low and should decrease rapidly over time as digital process technology advances. Digitizing the entire bandwidth of the cable system requires a very high sampling rate; therefore, an interleaved system may provide advantages over other conversion techniques.

Figure 1:
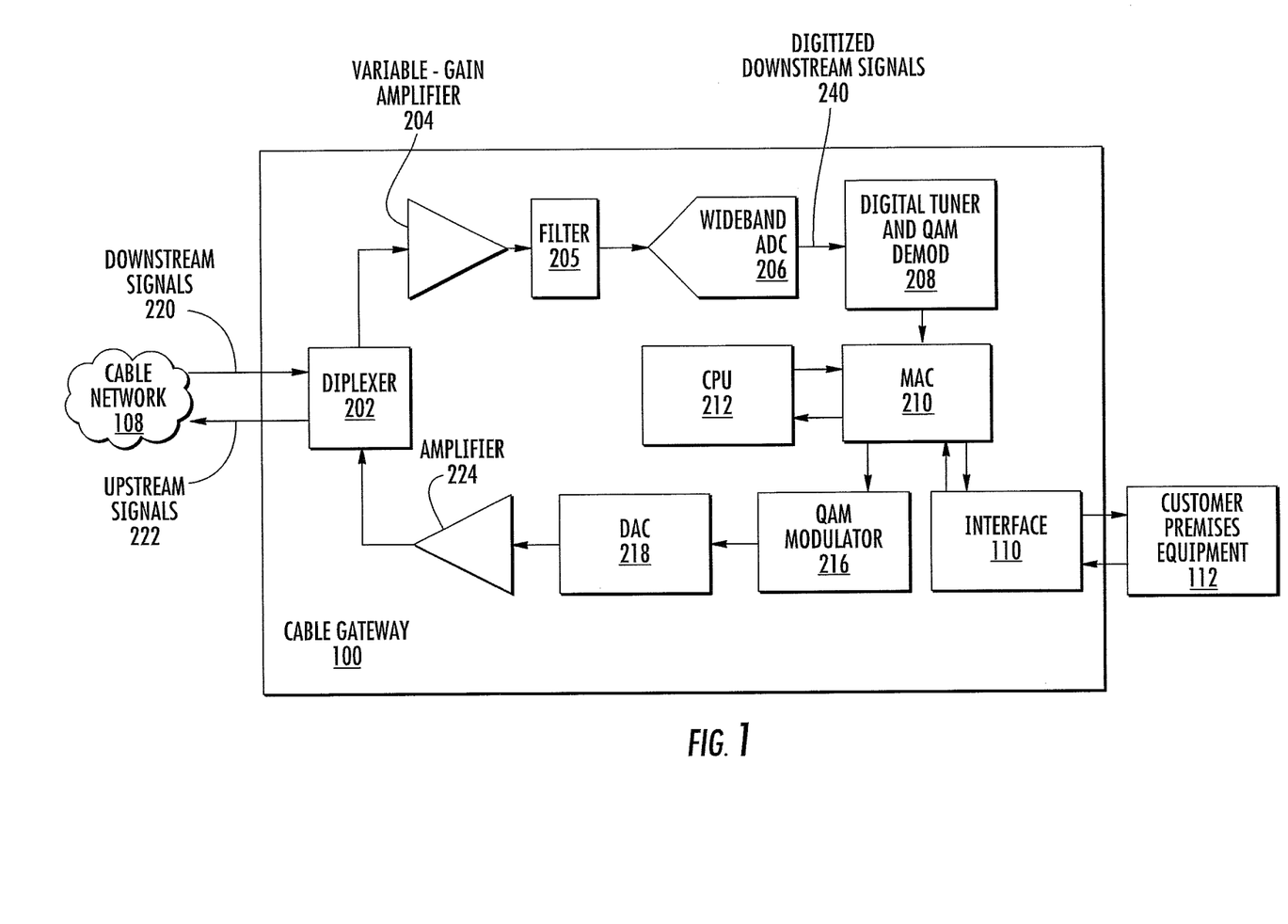
FIG. 1 is a block diagram of one example embodiment used in a cable gateway.

FIG. 1 shows an example cable gateway 100 connected to a cable network 108, which may be a coaxial, optical fiber, or hybrid fiber/coaxial cable television (CATV) network. The cable gateway 100 transmits data to and receives data from customer premises equipment 112. Typically, customer premises equipment 112 includes computers, televisions, and telephones.

The cable gateway 100 disclosed herein can be configured to operate according to any suitable specification for transmitting and receiving data, including but not limited to DOCSIS 3.0, Comcast RNG, SCTE 40, T3/S10 ATSC, OpenCable. Or other specifications.

Certain of these specifications require the cable gateway 100 to simultaneously tune to multiple 6 MHz channels for receiving television, voice, and data signals. (For example, DOCSIS 3.0 specifies the ability to independently tune at least four channels.) The ability to tune multiple channels is necessary to watch different television channels on different televisions.

Unlike conventional cable gateways, the cable gateway 100 shown in FIG. 1 uses a wideband, time-interleaved, analog-to-digital converter (ADC) 206 to digitize signals received from the cable network 108. The output from the wideband ADC can be tuned digitally, rather than with analog tuners, resulting in lower power consumption compared to alternative methods.

More particularly, in the example cable gateway 100, signals transmitted to and from the cable network 108 are coupled via a diplexer 202, which separates downstream (received) signals 220 from upstream (transmitted) signals 222. In general, CATV networks are asymmetric networks: the bandwidth dedicated to the downstream signals 220 is greater than the bandwidth dedicated to the upstream signals 222.

The diplexer 202 directs downstream traffic to a variable-gain amplifier (VGA) 204, which amplifies the received signal before transmitting it through a filter 205 to a wideband ADC 206. The time-interleaved ADC 206 digitizes the received signal, then passes the digitized downstream signals 240 to a digital tuner and quadrature-amplitude-modulation (QAM) demodulator 208. (Alternative embodiments may use other suitable modulation schemes.) In some embodiments, the digital tuner and QAM demodulator 208 tunes and demodulates the amplified, filtered, and digitized downstream signals 240 in accordance with either 64-QAM or 256-QAM techniques to recover the underlying information.

Figure 2:
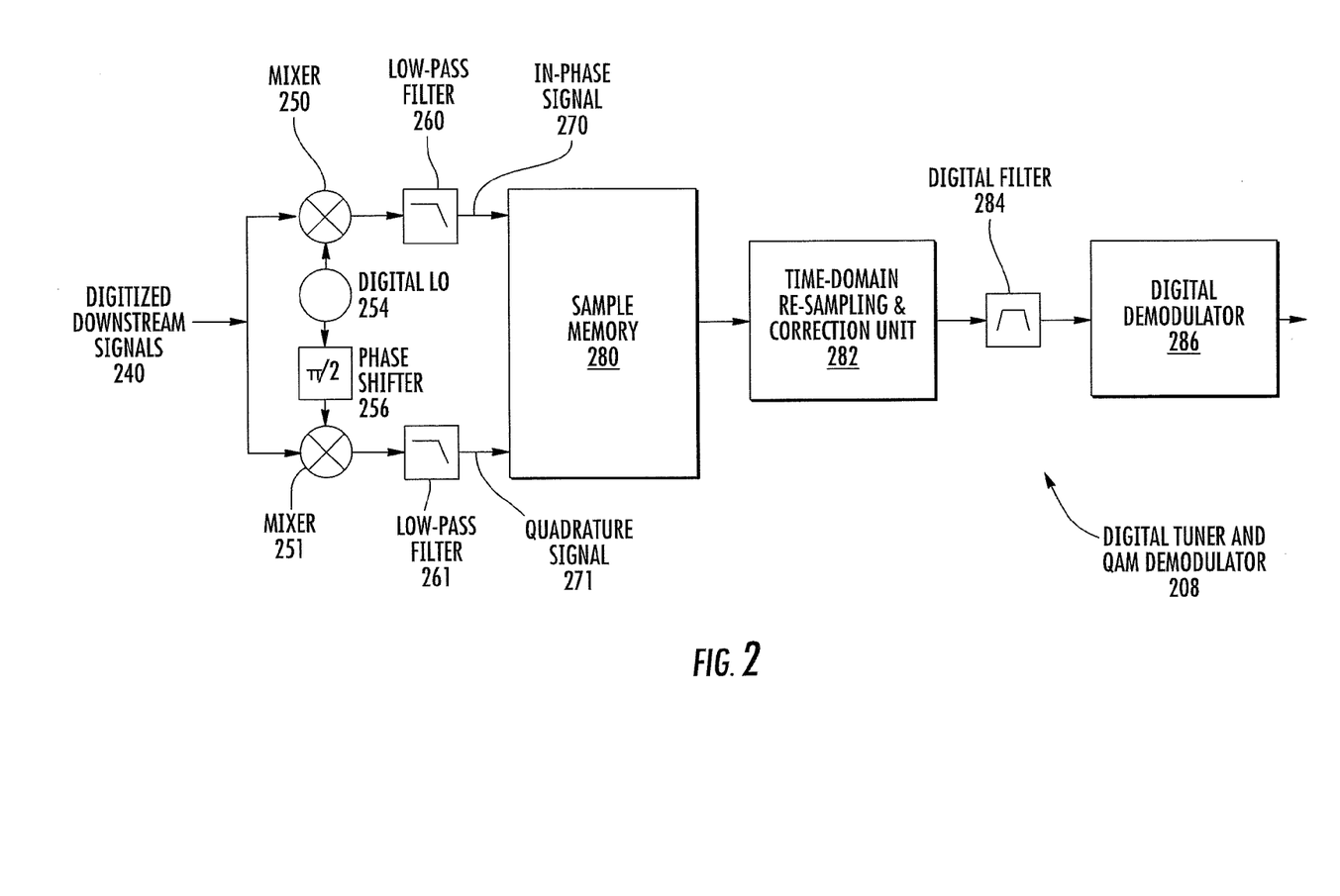
FIG. 2 is more detailed diagram of a digital tuner and Quadrature Amplitude Modulation (QAM) demodulator.

FIG. 2 shows an example embodiment of digital tuner and QAM demodulator 208 in more detail. The digitized downstream signals 240 are directed to first and second mixers 250 and 251. The first mixer 250 beats the digitized downstream signals 240 against a signal from a digital local oscillator (LO) 254 to produces a baseband signal that is filtered by a low-pass filter 260, producing an in-phase signal 270. The second mixer 251 beats the digitized downstream signals 240 against a signal from the digital LO 254 that is shifted in phase by 90° by a phase shifter 256. A low-pass filter 261 filters the mixer output to produce a quadrature signal 271.

A sample memory 280 stores time-domain versions of the in-phase signal 270 and the quadrature signal 271. The signals 270, 271 are re-sampled and corrected with is a time-domain re-sampling and correction unit 282 before being filtered with a digital filter 284 and demodulated with a digital demodulator 286.

As shown in FIGS. 1 and 2, the time-interleaved ADC 206 enables a tuning and demodulation architecture that is more efficient and fundamentally different than the architectures of gateways that use analog tuners. The specifics of the digital tuning and demodulation (e.g., channel center frequency, channel bandwidth, number of channels, noise margin, etc.) depend on the cable gateway/modem standard implementation, as will be understood by those skilled in the art.

Referring again to FIG. 1, a media access controller (MAC) 210 and a central processing unit (CPU) 212 process the demodulated downstream signals 222 from the digital tuner and QAM demodulator. In example embodiments, the MAC 210 is an open system interconnection (OSI) layer-2 element that frames the data into Internet Protocol (IP) packets or frames according to DOCSIS 3.0. (All DOCSIS-compatible devices are expected to be backwards compatible, meaning that embodiments compatible with DOCSIS 3.0 are necessarily compatible with earlier DOCSIS standards.) The MAC may also route encoded video and audio signals to customer-premises equipment. The functions of the MAC 210 may be implemented in hardware, software, or a combination of the two. Software implementations may be stored in read-only memory or random-access memory (not shown) and executed by the CPU 212.

The MAC 210 transmits packets and frames to customer-premises equipment 112 via an interface 110. Customer premises equipment 112 may be a telephone, a television, and/or a computer. In various embodiments, the interface 110 may be a universal serial bus (USB) interface, an IEEE 1394 interface, or any other suitable interface.

In addition to receiving processed downstream traffic 220, customer premises equipment 112 may also transmit data through the upstream channel 222 of the cable network 108 via the cable modem 100. The interface 110 transmits data from customer premises equipment 112 to the MAC 210, which formats the data, then sends it to a is QAM modulator 216. Again, alternative embodiments may use other modulation schemes.

A digital-to-analog converter (DAC) 216 converts the modulated digital signals into an analog output, which is amplified by an amplifier 224. The diplexer 202 directs the output of the amplifier 220 to the cable network 108 over the upstream channel 222. In embodiments, the QAM modulator 216, the DAC 218, and the amplifier 224 typically operate over lower bandwidths than the QAM demodulator 208, the wideband ADC 206, and the VGA 204.

Time-Interleaved Wideband ADCs

Figure 3:
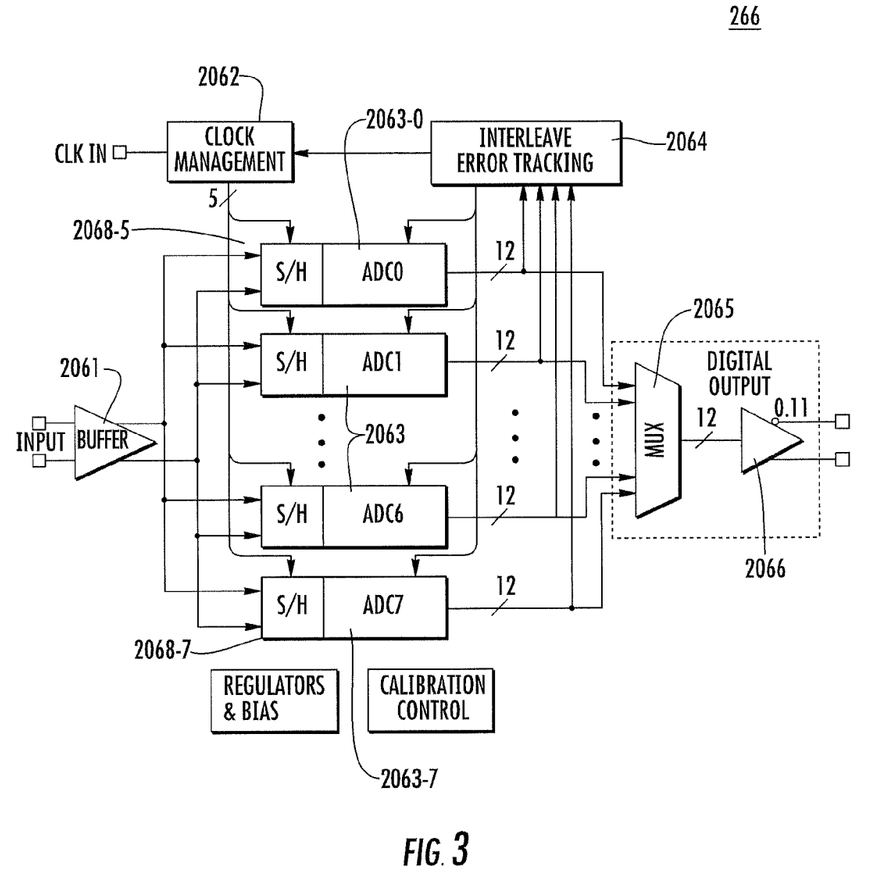
FIG. 3 is a more detailed diagram of a wideband, time-interleaved, analog-to-digital converter (ADC).

FIG. 3 is a block diagram of an example embodiment of a wideband time-interleaved ADC 206 as used to process the downstream signal. The wideband time-interleaved ADC 206 uses a parallel array of time-interleaved subunit ADCs 2063. Here there are eight subunit ADCs 2063-0, 2063-1, . . . , 2063-7 labeled ADC0, ADC1, . . . , ADC7 and which are collectively referred to as the subunit ADCs 2063. In other embodiments, the ADC 206 may include fewer than eight or more than eight subunit ADCs, and in the discussion below, the number of subunit ADC's is generally referred to as "M". Each subunit ADC 2063 has a corresponding sample and hold (S/H) circuit 2068.

In a preferred embodiment, the subunit ADCs 2063 are charge-domain ADCs such as those disclosed in a previous patent application by one of the same inventors herein (Michael P. Anthony, U.S. patent application Ser. No. 11/807,914, filed May 30, 2007, entitled "Boosted Charge Transfer Circuit"), which is incorporated by reference in its entirety, although other ADC designs are possible.

In the embodiment of FIG. 3, the source impedance of the input signal, INPUT, is reduced by an input buffer 2061 to a low value appropriate for driving the M parallel inputs of each of the M subunit ADCs 2063.

The wideband ADC 206 operates at a high frequency conversion rate by sampling the input signal INPUT at an overall sampling rate Fs (and corresponding is sampling period T=1/FS). In some embodiments, an internal clock circuit may supply the clock signal FS; in other embodiments, an external clock may supply the clock signal FS via a clock input terminal CLKIN. A clock management unit 2062 handles synchronization of and distribution of the clock signal to the subunit ADCs 2063.

In the preferred embodiment an externally supplied clock FS is generated via the Clock Management block 2062, such that each of the subunit ADCs 2063-0 through 2063-7 are triggered sequentially at a subunit rate of FS1. The samples taken by the subunit ADCs 2063 are therefore interleaved in time for an aggregate sample rate equal to the clock rate FS. This interleaving architecture allows each of the subunit ADCs 2063 to operate at relatively lower speed, FS1, giving them more time to convert the signal with higher accuracy.

It is important that the subunit ADCs 2063 be well matched to avoid generation of spurious signals. To accomplish this end, their digital outputs are monitored by Interleave Error Tracking block 2064, which calculates any matching error and adjusts the timing or the subunit ADC's 2063 offset or gain to minimize the error. The outputs of the subunit ADCs 2063 may be multiplexed together by a MUX 2065 and then passed to the next digital-processing block via a driver 2066 as a single serial data stream. The subunit ADC outputs may also be handled individually as a parallel output stream if that format is more appropriate for the following digital processing.

Turning again now to the specific application in cable systems, and specifically to one implementation, a Cable Television Channel Identification Plan defined by the Consumer Electronics Association (CEA) known as CEA-542-B, is a standard defining the spectral allocation for downstream channel communication from head-end to customer premises. At the time of this writing, this standard is followed by the majority of Cable TV service providers in North America. This standard defines the channel boundaries for 158 channels, most having 6 MHz bandwidth. The table in FIG. 4 contains the lower and upper edge frequencies for these 158 channels as defined in CEA-542-B.

Figure 4:
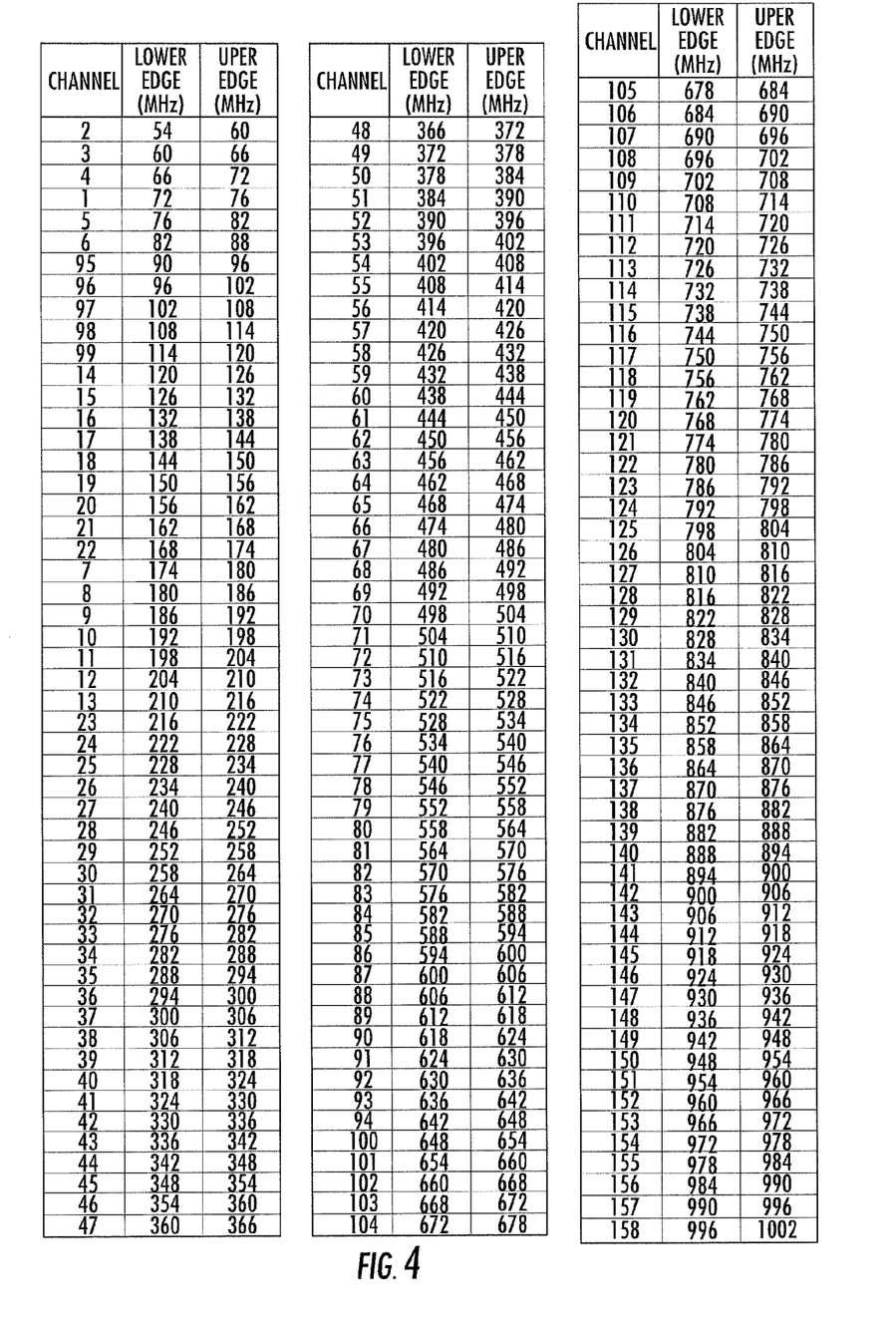
FIG. 4 is a table of lower and upper edge frequencies defined in CEA-542-B.

All channels except Channels 1, 5 and 6 have their guard-bands centered on is integer multiples of 6 MHz. Ignoring these special cases for now, we can derive an aggregate sample frequency for an interleave system that will sample the entire downstream bandwidth while avoiding the two problems described in the earlier section.

To address the first problem stated above, it is advantageous to co-locate the Nyquist frequency of a component converter (e.g., the subunit ADCs 2063 of FIG. 3), at ½×FS1, with a guard-band. This requires that a component converter 2063 sample rate FS1 be an integer multiple, J, of 12 MHz.

$$FS1 = J \times 12 \text{ MHz}$$

where FS1 is the sample rate of a component converter and J is an integer.

The relation above also guarantees that all integer multiples of the Nyquist frequency of a component converter are aligned to a multiple of 6 MHz, thus ensuring minimal signal power at all frequencies identified in the first problem.

To address the second problem, it is advantageous to co-locate the sample frequency of a component converter, FS1, with a guard-band. This requires that a component converter sample at an integer multiple, K, of 6 MHz.

$$FS1 = K \times 6 \text{ MHz}$$

where FS1 is the sample rate of a component converter and K is some integer.

The relation above also guarantees that all integer multiples of the sample frequency of a component converter are aligned to a multiple of 6 MHz, thus ensuring that spurs resulting from insufficient calibration of offset mismatch occur within a guard-band.

It is clear that solving the first problem, also solves the second because an integer multiple of 12 MHz is always an integer multiple of 6 MHz as well.

It can now be seen that with this plan, the guard-bands for channels 1, 5 and 6 will not be located on a multiple of 6 MHz. This issue can be addressed with additional criteria for FS1. There are two possible integer multiples of 6 MHz that fall within channel boundaries: 13×6 MHz=78 MHz, which lies within channel 5; and 14×6 MHz=84 MHz, which lies within channel 6. It is possible to ensure that FS1 and ½×FS1 do not fall at these frequencies by adding an additional constraint on the selection of sampling frequencies. To achieve this, the allowable values for FS1 may be further constrained as follows:

$$FS1=J\times 12 \text{ MHz with } J\neq 7, 13 \text{ or } 14$$

This additional restriction on FS1 does not necessarily have to be followed in order to obtain the benefit of the sampling method described here. With respect to the first problem, this is because the relative power contained in one channel is low compared to the remaining downstream spectrum, so it may be possible to obtain acceptable accuracy in error metrics even if one of these channels falls on an integer multiple of ½×FS1. With respect to the second problem, this is because the interference resulting from an offset spur within one of these channels may be tolerable.

To complete this example, an interleaved system sampling the entire downstream bandwidth requires an aggregate sample rate, FS, greater than 2 times the highest frequency in the spectrum of interest. For this example system being discussed herein, the highest frequency of interest is 1002 MHz, so FS must be greater than 2004 MHz. This aggregate rate may be achieved with some quantity, M, of component converters (e.g., multiple subunit ADCs 2063 as shown in FIG. 3).

$$FS=M\times FS1=M\times J\times 12 \text{ MHz}>2004 \text{ MHz}$$

Substituting J×12 MHz for FS1 gives the requirement for M and J:

$$M\times J>167$$

The component sample rate, FS1 and the number of components, M, may be traded off to optimize parameters of consequence for the system, such as size, cost or power.

Figure 5:
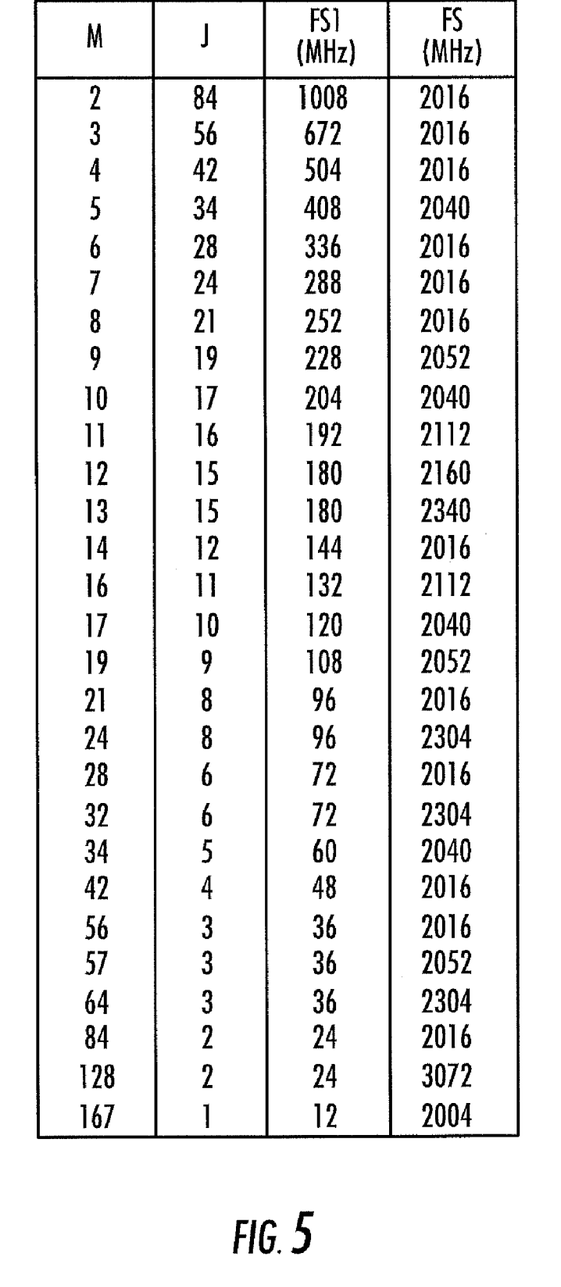
FIG. 5 is a table of combinations of M (number of converters) and J (an integer multiple) and resulting component and component and aggregate sample rates, FS1 and FS for one example embodiment.

The table in FIG. 5 provides some example combinations of M and J and the resulting component and aggregate sample rates, FS1 and FS for this example embodiment.

Other Examples

Other constraints may be put on the sampling rates while remaining consistent with the methodology described here. An example might be a higher minimum sample rate. This could be imposed to facilitate oversampling of the band-of-interest which can ease analog filtering, digital down-conversion or other signal processing blocks downstream of the converter. Another example might be to impose an additional factorization requirement on the sample rate to make the converter clock frequency a convenient multiple of another clock in the system.

A more specific example that includes both of the additional requirements mentioned above is a cable system that supports home networking communication over the same coaxial cable on which the channels defined in CEA-542-B exist. Home networking may use frequencies above 1002 MHz without directly interfering with the information below 1002 MHz. The Multimedia over Coax Alliance (MoCA) has standardized one such networking implementation that can occupy frequencies up to 1550 MHz.

Assuming that the goal of digitizing the channels up to 1002 MHz remains, there are a few options to avoid aliasing of the home networking information into the band-of-interest. The first option would be to sample at twice the highest frequency in the system, 3100 MHz, but this is over 50% higher than actually required for the band-of-interest and would certainly result in higher power consumption for the converter than necessary. A second option might be to use Nyquist sampling and an anti-aliasing filter to suppress the signal power above 1002 MHz so that the aliased content is below the noise floor of the system. This would likely require an expensive analog filter.

An intermediate option would be to sample at twice the average of 1002 MHz and 1550 MHz, or 2552 MHz. This ensures that the MoCA information content aliases only onto itself in a band from 1002 MHz to 1226 MHz, and therefore does not interfere with the cable channel information below 1002 MHz.

This example can be completed with one additional system constraint. If we assume that a digital down-converter and demodulator behind the converter require a 10 MHz clock, then it may be advantageous to have the time interleaved analog-to-digital converter sample clock also be a multiple of 10 MHz. This can be achieved by adding a second requirement:

$$FS=M\times J\times 12 \text{ MHz}>1002 \text{ MHz}+1550 \text{ MHz} \qquad (1)$$

$$M\times J>208.5$$

and $$M\times J\times 12 \text{ MHz}/10 \text{ MHz}=\text{an integer} \qquad (2)$$

An equivalent way of saying this is:

$$FS=M\times J\times LCM(10,12)>2552$$

where LCM(x,y) is the least-common-multiple operation.

Figure 6:
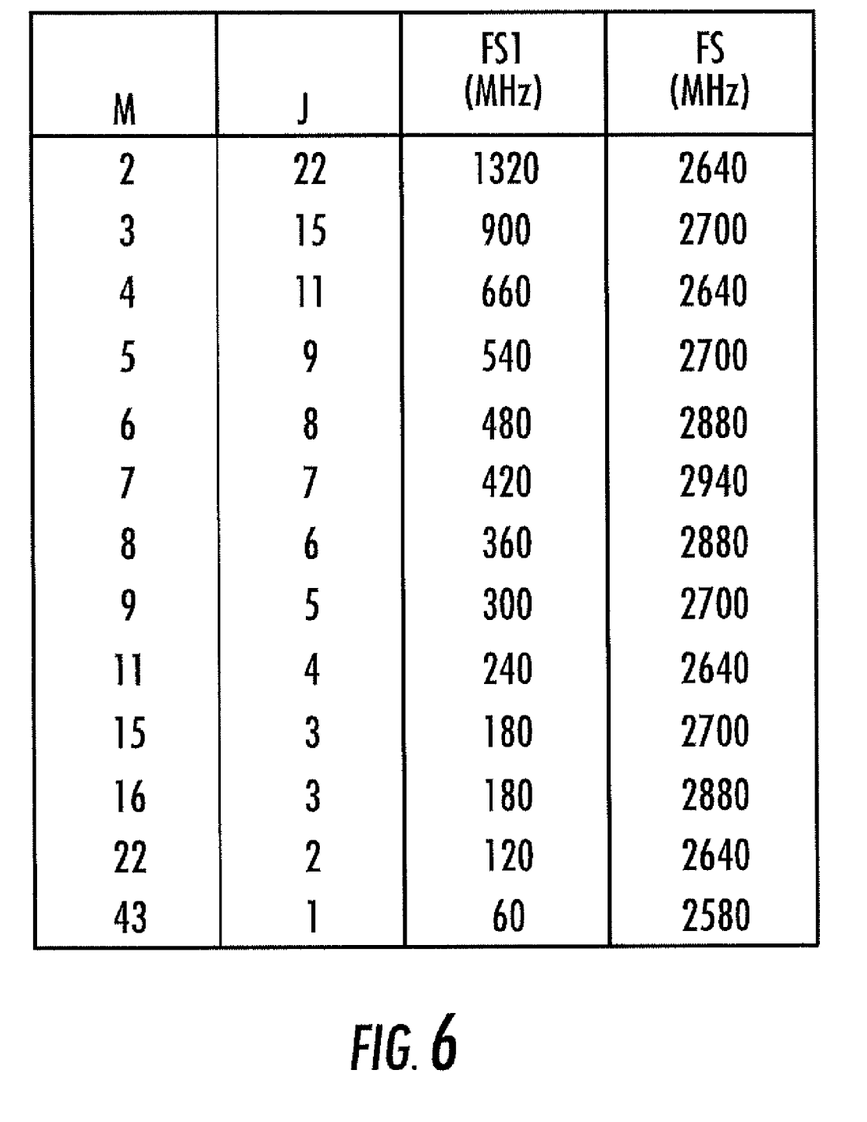
FIG. 6 is a table of combinations of M and J and the resulting sample rates, FS1 and FS for another example

The table in FIG. 6 provides some example combinations of M and J and the resulting component and aggregate sample rates, FS1 and FS that satisfy these constraints.

Although what has been described above is an embodiment for a communication system that has a 6 MHz channel spacing, it can now be understood that the same principles can be similarly applied to other frequency multiplexed systems having a general channel spacing, CS.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for receiving a signal from a frequency multiplexed communication system comprising:
    a plurality, M, of time-interleaved analog-to-digital converter (ADC) subunits, coupled to receive the signal from the frequency multiplexed communication system at an input and provide a digital representation thereof at an output; and
    a clock circuit, coupled to provide one or more clock signals to the plurality, M, of time-interleaved ADC subunits, such that at least one of the ADC subunits samples the frequency multiplexed communication signal at a sample clock rate, FS1, and such that the M ADC subunits together providing an aggregate sample clock rate, FS, of the frequency multiplexed communication signal, and further such that FS1 is a predetermined frequency selected to locate a Nyquist frequency of a respective one of the M ADC subunits in one or more guard band regions of the frequency-multiplexed communication system, and such that one or more integer multiples of FS1 are located in one or more guard band regions of the frequency-multiplexed communication system.

2. The apparatus of claim 1 wherein the clock circuit further calibrates the time-interleaved ADC subunits by generating a sample clock signal, FS1, such that spurious content in the digital representation provided at the output is also located in at least one guard band region.

3. An apparatus for receiving a signal from a frequency multiplexed communication system comprising:
   a plurality, M, of time-interleaved analog-to-digital converter (ADC) subunits, coupled to receive the signal from the frequency multiplexed communication system at an input and provide a digital representation thereof at an output;
   a clock circuit, coupled to provide one or more clock signals to the plurality, M, of time-interleaved ADC subunits, such that at least one of the ADC subunits samples the frequency multiplexed communication signal at a sample clock rate, FS1, and such that the M ADC subunits together providing an aggregate sample clock rate, FS, of the frequency multiplexed communication signal, and further such that FS1 is a predetermined frequency selected to locate a Nyquist frequency of a respective one of the M ADC subunits in one or more guard band regions of the frequency-multiplexed communication system, and such that one or more integer multiples of FS1 are located in one or more guard band regions of the frequency-multiplexed communication system; and
   wherein guard bands for selected channels of the frequency-multiplexed communication system are not located on integer multiples of a channel spacing, and additional constraints are added to the sampling frequency, FS1, such that one or more selected integer multiples of the sampling frequency, FS1, do not fall within the selected channels.

4. The apparatus of claim 1 wherein $FS=M \times FS1$ and

FS is greater than a Nyquist sampling rate of the frequency multiplexed communication signal.

5. The apparatus of claim 1 wherein the communication system is cable system.

6. The apparatus of claim 5 wherein a nominal channel spacing used in the cable system is 6 MHz, and $FS1=J \times 12$ MHz where J is an integer such that J does not equal 7, 13 or 14.

7. The apparatus of claim 6 wherein a Nyquist sampling rate of the frequency multiplexed communication signal in the cable system is 2004 MHz, so that $FS=M \times J \times 12$ MHz$>2004$ MHz where $M \times J > 167$.

8. The apparatus of claim 1 wherein the frequency multiplexed system is a cable system that provides a stated number of frequency multiplexed cable channels, and at least one additional signal is received having frequency content above the highest cable channel, and wherein FS is selected as a least common multiple of FS1 and a sample clock used to sample the additional signal.

9. A method for receiving a signal from a frequency multiplexed communication system comprising:
   receiving a frequency multiplexed communication signal;
   providing a digital representation of the frequency multiplexed communication signal at a plurality, M, of time-interleaved analog-to-digital converter (ADC) subunits; and
   calibrating the plurality, M, of time-interleaved ADC subunits by providing one or more clock signals to the at least one of the time-interleaved ADC subunits, such that at least one ADC subunit samples the frequency multiplexed communication signal at a sampling rate, FS1, and such that the M ADC subunits together providing an aggregate sample rate, FS, and such that one or more spurious signal due to mismatch in the subunit ADCs fall within a predetermined guard band of the frequency multiplexed communication system.

10. The method of claim 9 wherein the sampling frequency is further selected such that a Nyquist frequency of a respective one of the M ADC subunits is co-located with one or more guard band regions of the frequency-multiplexed communication system, and such that one or more integer multiples of FS1 are co-located in one or more guard band regions of the frequency-multiplexed communication system.

11. A method for receiving a signal from a frequency multiplexed communication system comprising:
   receiving a frequency multiplexed communication signal;
   providing a digital representation of the frequency multiplexed communication signal at a plurality, M, of time-interleaved analog-to-digital converter (ADC) subunits;
   calibrating the plurality, M, of time-interleaved ADC subunits by providing one or more clock signals to the at least one of the time-interleaved ADC subunits, such that at least one ADC subunit samples the frequency multiplexed communication signal at a sampling rate, FS1, and such that the M ADC subunits together providing an aggregate sample rate, FS, and such that one or more spurious signal due to mismatch in the subunit ADCs fall within a predetermined guard band of the frequency multiplexed communication system; and
   wherein guard bands for selected channels are not located on integer multiples of a channel spacing, and additional constraints are added to the sampling frequency, FS1, such that one or more selected integer multiples of the sampling frequency do not fall within the selected channels.

12. The method of claim 9 wherein $FS=M \times FS1$;

and

FS is greater than a Nyquist sampling rate of the frequency multiplexed communication signal.

13. The method of claim 9 wherein the communication system is cable system.

14. The method of claim 13 and further wherein a nominal channel spacing used in the cable system is 6 MHz, and $FS1=J \times 12$ MHz where J is an integer such that J does not equal 7, 13 or 14.

15. The method of claim 14 wherein a Nyquist sampling rate of the frequency multiplexed communication signal in the cable system is 2004 MHz, so that $$FS = M \times J \times 12 \text{ MHz} > 2004 \text{ MHz}$$

and $$M \times J > 167.$$

16. The method of claim 9 wherein the frequency multiplexed system is a cable system that provides a stated number of frequency multiplexed cable channels, and at least one additional signal is received having frequency content above the highest cable channel, and wherein FS is selected as a least common multiple of FS1 and a sample clock used to sample the additional signal.

* * * * *

UNITED STATES PATENT AND TRADEMARK OFFICE
CERTIFICATE OF CORRECTION

PATENT NO. : 8,310,387 B2
APPLICATION NO. : 12/862470
DATED : November 13, 2012
INVENTOR(S) : Harris et al.

Page 1 of 1

It is certified that error appears in the above-identified patent and that said Letters Patent is hereby corrected as shown below:

Col. 1, line 51 should read: ""calibration" will is be used to describe either mismatch"

Col. 5, line 24 should read: "which formats the data, then sends it to a is QAM modulator"

Col. 5, line 61 should read: "sampling rate Fs (and corresponding is sampling period T = 1/"

Col. 6, line 36 should read: "bands centered on is integer multiples of 6 MHz. Ignoring"

Signed and Sealed this
Nineteenth Day of March, 2013

Teresa Stanek Rea
*Acting Director of the United States Patent and Trademark Office*